United States Patent
Liu et al.

(12) United States Patent (10) Patent No.: US 8,218,353 B1
Liu et al. (45) Date of Patent: Jul. 10, 2012

(54) MEMORY ELEMENT CIRCUITRY WITH STRESSED TRANSISTORS

(75) Inventors: Jun Liu, Santa Clara, CA (US);
Shankar Sinha, Redwood City, CA (US); Qi Xiang, San Jose, CA (US);
Yow-Juang Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 12/561,236

(22) Filed: Sep. 16, 2009

(51) Int. Cl.
*G11C 11/00* (2006.01)

(52) U.S. Cl. ............. 365/156; 365/49.11; 365/154; 365/174; 365/188; 365/189.15; 365/189.17; 365/189.05

(58) Field of Classification Search ............ 365/156, 365/49.11, 154, 174, 188, 189.15, 189.17, 365/189.05, 189.25
See application file for complete search history.

(56) References Cited

U.S. PATENT DOCUMENTS

| | | | |
|---|---|---|---|
| 6,621,131 B2 | 9/2003 | Murthey et al. | |
| 6,867,433 B2 | 3/2005 | Yeo et al. | |
| 6,870,179 B2 | 3/2005 | Shaheed et al. | |
| 6,882,025 B2 | 4/2005 | Yeo et al. | |
| 6,884,667 B1 | 4/2005 | Doris et al. | |
| 7,830,727 B2 * | 11/2010 | Arsovski et al. | 365/189.15 |
| 2007/0040199 A1 * | 2/2007 | Kotani | 257/296 |
| 2008/0057665 A1 * | 3/2008 | Lindsay | 438/400 |
| 2008/0101117 A1 * | 5/2008 | Ogura et al. | 365/185.05 |
| 2008/0280391 A1 | 11/2008 | Shin et al. | |
| 2009/0166750 A1 * | 7/2009 | Eda | 257/369 |
| 2009/0321840 A1 * | 12/2009 | Pidin | 257/369 |

OTHER PUBLICATIONS

"Determining the limits of strain techniques in scaled CMOS devices" [online]. IMEC [retrieved on Jul. 27, 2009]: <http://maltiel-consulting.com/limit_Strain_Scaling_CMOS_Contact_Etch_Stop_Layer_CESL.html>.

* cited by examiner

*Primary Examiner* — Fernando Hidalgo
(74) *Attorney, Agent, or Firm* — Treyz Law Group; Jason Tsai

(57) ABSTRACT

Integrated circuits with memory elements are provided. The memory elements may be arranged in a memory block. The memory block may include cross-coupled inverters that store data. The stored data may be used to program pass transistors. Transistors in the memory block may be stressed. Depending on the type of stress-inducing layer used, a tensile stress or a compressive stress may be built in into the transistors. Stressed transistors may help improve the routing speed of the memory block. Stressed transistors may be implemented using dual gate-oxide process.

16 Claims, 15 Drawing Sheets

MEMORY ELEMENT CIRCUITRY WITH STRESSED TRANSISTORS

BACKGROUND

This invention relates to memory elements and associated pass transistors, and more particularly, to memory element circuitry with stressed transistors.

Integrated circuits often contain volatile memory elements. Typical volatile memory elements are based on cross-coupled inverters (latches) and are used to store data. Each memory element can store a single bit of data. In integrated circuits such as programmable integrated circuits, volatile memory elements are used to store configuration data.

Memory elements are typically arranged in arrays. Data may be loaded into the memory elements of the array and may be read from the memory elements of the array using data lines. Once loaded, the output of a memory element in a programmable integrated circuit can serve as a static control signal that is applied to the gate of an associated pass transistor. Blocks of programmable logic can be customized by turning on and off appropriate pass transistors in this way.

To ensure satisfactory high-speed operation, it may be desirable to overdrive the pass transistors. In a typical overdrive scheme, pass transistors are controlled using larger voltage levels than are normally used in powering logic gates. To accommodate overdriven control signals, pass transistors on programmable integrated circuits can be fabricated using low-power (LP) devices. LP devices have thicker gate oxide than general purpose (G) devices and are therefore able to accommodate elevated gate voltages.

In addition to G devices and LP devices, memory circuitry on a programmable integrated circuit may have input-output (I/O) devices that are formed using gate oxides that are thicker than those of G devices and thicker than those of LP devices. This type of conventional arrangement involves a triple gate oxide process (i.e., separate masks are used for the G gate oxide, the LP gate oxide, and the I/O gate oxide). Compared to a dual gate oxide process (e.g., a process that involves two different gate oxide thicknesses), the triple gate oxide process requires extra masks and more complex processing.

It would therefore be desirable to be able to provide improved memory element circuitry for integrated circuits such as memory element circuitry for programmable integrated circuits that can be fabricated using dual gate oxide process.

SUMMARY

In accordance with the present invention, integrated circuits are provided with arrays of memory elements.

The memory elements may be used to store data. For example, the memory elements may be used to store configuration data on a programmable integrated circuit such as a programmable logic device integrated circuit. Each memory element may have an output that supplies the gate of a programmable routing pass transistor with a static control signal. The routing pass transistors may be used to form programmable logic on the integrated circuit.

Each memory element may include a pair of cross-coupled inverters (latches). Each memory element can store a single bit of data (i.e., configuration data), which can be used to program an associated pass transistor. The memory element may be fabricated using dual gate oxide complementary metal-oxide-semiconductor (CMOS) technology. Transistors associated with the memory element may be stressed with stress-inducing layers during fabrication. Stressed transistors may perform better than unstressed transistors, thereby reducing the need for transistor gates of different thicknesses. The layout of the memory element and its associated pass transistor circuitry may be optimized to reduce area and maximize benefits from built-in stress.

Further features of the memory element, its nature and various advantages will be more apparent from the accompanying drawings and the following detailed description.

DETAILED DESCRIPTION

Figure 1:
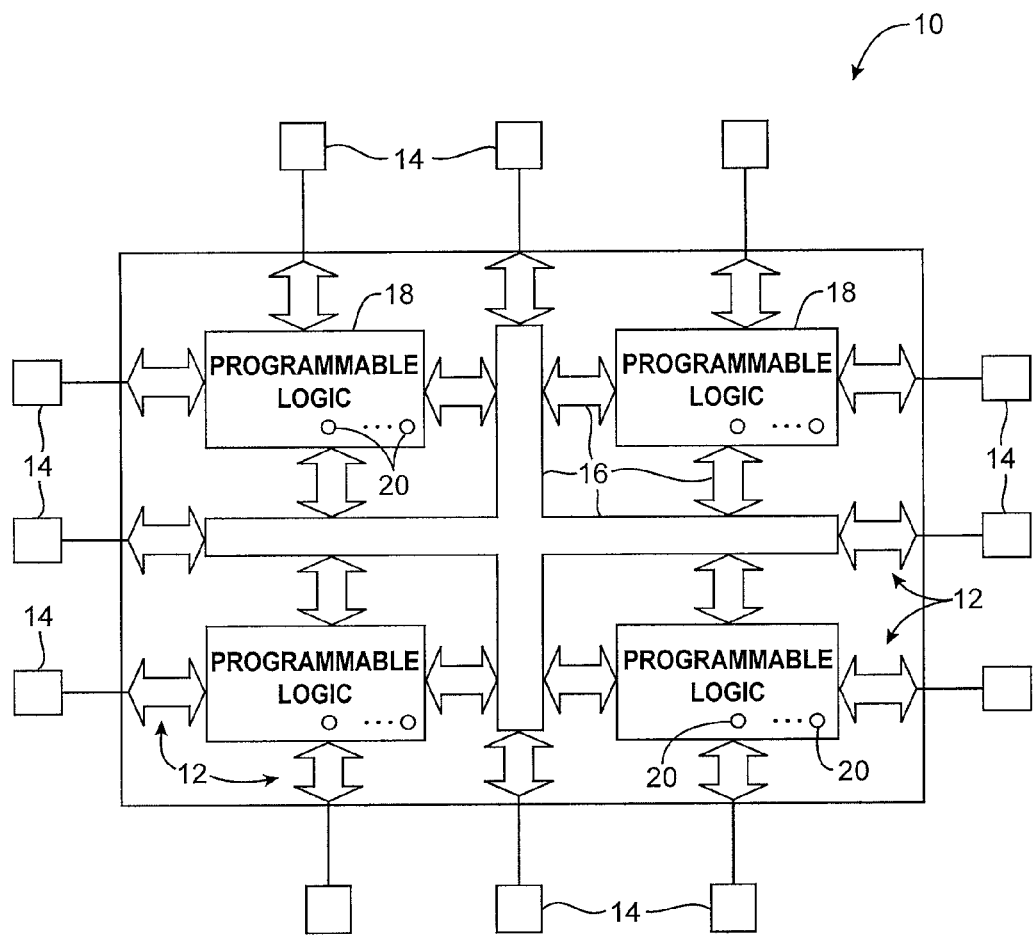
FIG. 1 is a diagram of an illustrative integrated circuit with an array of memory elements such as a programmable logic device integrated circuit or other programmable integrated circuit in accordance with an embodiment of the present invention.

The present invention relates to memory elements and integrated circuits that contain memory elements. The invention also relates to integrated circuits with stressed transistors. Integrated circuits that include memory elements and associated pass transistors with stressed structures may be fabricated using a dual gate oxide process to reduce mask complexity and manufacturing expenses.

The integrated circuits that contain the memory elements may be memory chips, digital signal processing circuits with memory arrays, microprocessors, application specific integrated circuits with memory arrays, programmable logic device integrated circuits or other programmable integrated circuits in which memory elements are used for configuration memory, or any other suitable integrated circuits. For clarity, the present invention will sometimes be described in the context of programmable integrated circuits such as programmable logic device integrated circuits in which volatile memory elements are used to store configuration data. This is, however, merely illustrative. The memory elements and memory element circuitry of the invention may be used in the context of any integrated circuits that use memory.

Programmable integrated circuits such as programmable logic device integrated circuits use programmable memory elements to store configuration data. During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function. In a typical arrangement, each static output signal serves as a gate control signal that is applied to the gate of an n-channel or p-channel metal-oxide-semiconductor transistor.

The programmable logic in which the n-channel and p-channel transistors are contained makes up part of the main logic of the programmable logic device and associated programmable interconnections. This programmable logic is powered using a positive power supply voltage that is generally referred to as Vcc and a ground voltage that is generally referred to as Vss. Typical Vcc and Vss values are 1.0 volts and 0 volts, respectively. It is expected that advances in semiconductor technology will allow smaller power supply voltages to be used in future integrated circuits, so Vcc values of less than 1.0 volts may be used. Values of Vcc larger than 1.0 volts and non-zero ground voltages Vss may also be used in an integrated circuit if desired.

Memory elements may be organized in arrays having numerous rows and columns. For example, memory array circuitry may be formed in hundreds or thousands of rows and columns on a programmable logic device integrated circuit. An illustrative integrated circuit on which memory array circuitry may be formed is programmable integrated circuit 10 of FIG. 1.

As shown in FIG. 1, programmable integrated circuit 10 may have input/output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable integrated circuit 10 contains memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Most of these transistors are generally n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

The memory elements may be loaded from any suitable source. With one illustrative arrangement, the memory elements are loaded from an external erasable-programmable read-only memory and control chip called a configuration device via pins 14 and input/output circuitry 12.

The memory elements 20 are generally arranged in an array pattern. In a typical modern programmable integrated circuit, there may be millions of memory elements 20 on each chip. During programming operations, the array of memory elements is provided with configuration data. Once loaded with configuration data, the memory elements 20 selectively control portions of the circuitry in programmable logic 18 and thereby customize its functions so that it will operate as desired. Data may be read from the array of memory elements using read circuitry. For example, configuration data may be read back from the memory elements following programming to verify that a programmable integrated circuit has been programmed correctly.

The circuitry of device 10 may be organized using any suitable architecture. As an example, the logic of programmable integrated circuit 10 may be organized in a series of rows and columns of larger programmable logic regions each of which contains multiple smaller logic regions. The logic resources of integrated circuit 10 may be interconnected by interconnection resources 16 such as associated vertical and horizontal conductors. These conductors may include global conductive lines that span substantially all of integrated circuit 10, fractional lines such as half-lines or quarter lines that span part of integrated circuit 10, staggered lines of a particular length (e.g., sufficient to interconnect several logic areas), smaller local lines, or any other suitable interconnection resource arrangement. If desired, the logic of integrated circuit 10 may be arranged in more levels or layers in which multiple large regions are interconnected to form still larger portions of logic. Still other device arrangements may use logic that is not arranged in rows and columns.

Figure 2:
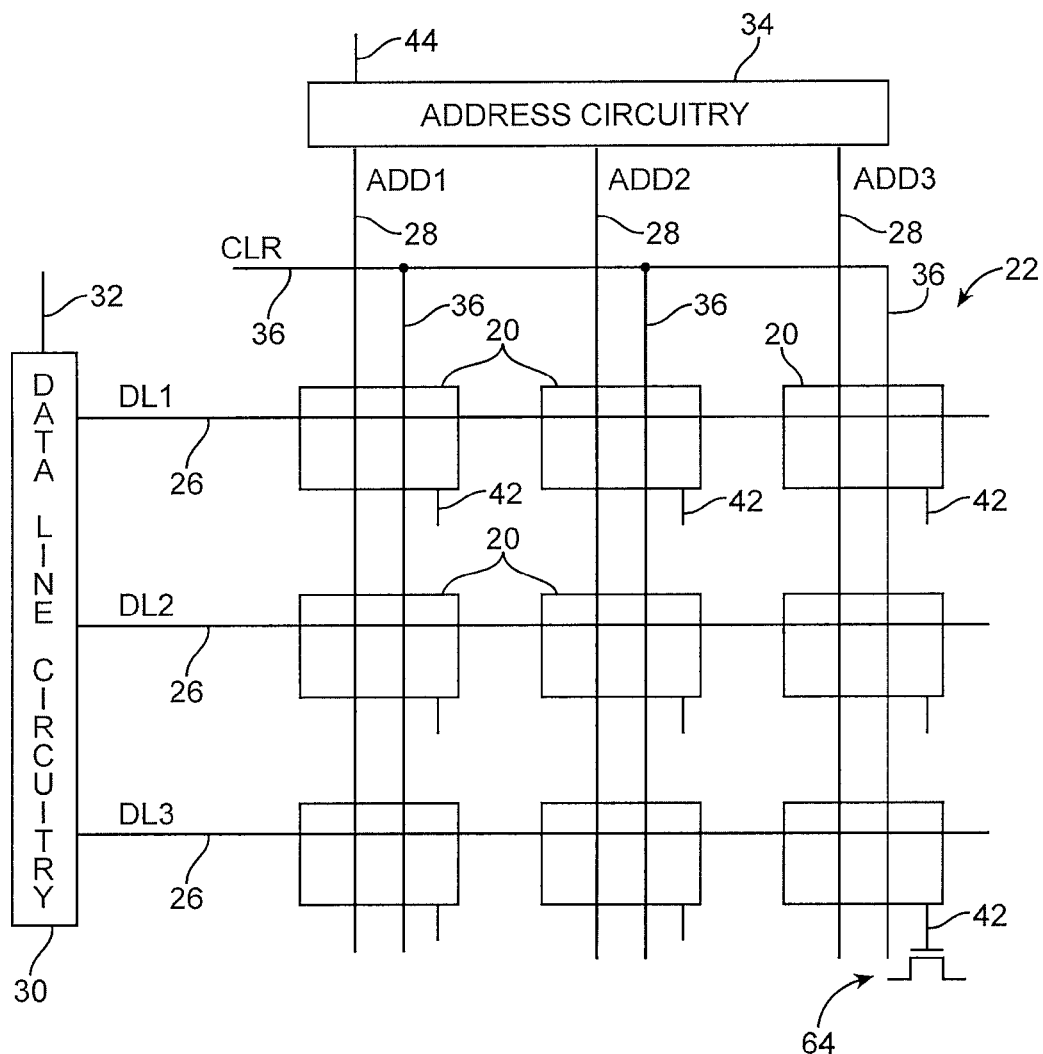
FIG. 2 is a diagram of an illustrative memory element array in accordance with an embodiment of the present invention.

When memory elements are arranged in an array, horizontal and vertical conductors and associated circuitry may be used to load the memory elements with configuration data and may be used to read data from the memory elements. An illustrative arrangement for data loading and data reading on integrated circuit 10 is shown in FIG. 2. The arrangement of FIG. 2 has a 3×3 array 22 of memory elements 20. (Actual memory arrays typically have hundreds or thousands of rows and columns, but a 3×3 array is used as an example.)

As shown in FIG. 2, a clear line 36 (labeled CLR) may be used to clear the contents of the memory array 22. After the array has been cleared, configuration data may be loaded. After configuration data has been loaded, the contents of memory elements 20 in array 22 may be read.

Configuration data may be provided in series to registers in data line circuitry 30 via input 32. During data writing operations, the configuration data may be provided in parallel to array 22 via the DL1, DL2, and DL3 data lines 26. During data read operations, data may be read from array 22 via the data lines 26.

Address decoder circuitry in address circuitry 34 may receive addressing information via input 44 during data writing and data reading operations. In response, the address decoder may assert a desired one of the address lines 28 (i.e., ADD1, ADD2, or ADD3). When an address line is asserted in a given column during data write operations, the data on the data lines 26 is loaded into the memory elements 20 in that column. The array may be filled by systematically loading the memory elements in each of the columns of the array. After the array has been completely loaded with configuration data, the static control output 42 of each memory element 20 produces a corresponding static control signal for controlling the gate of a pass transistor or other logic component on the programmable logic device (e.g., a pass transistor such as pass transistor 64). When an address line is asserted in a given column during data read operations, data from the memory elements in the addressed column is driven onto the data lines 26. Data line output latches and other read circuitry in data line circuitry 30 may be used in handling the data signals from data lines 26.

Array 22 may receive power supply voltages through suitable power supply lines. If desired, the positive power supply voltage that is used during normal operation may be greater than the power supply Vcc that is being used in programmable logic 18. In this type of configuration, the outputs from the memory elements that are loaded with logic ones are greater in magnitude than Vcc and thereby overdrive their associated pass transistors. Overdriven pass transistors handle high-speed signals better than normally-driven pass transistors.

Large overdrive levels can damage general purpose (G) transistors. To avoid damage, the amount of overdrive voltage that is used can be reduced or eliminated. At the same time, pass transistor performance can be enhanced to compensate using improved built-in stress configurations for the memory element and pass transistors.

Figure 3:
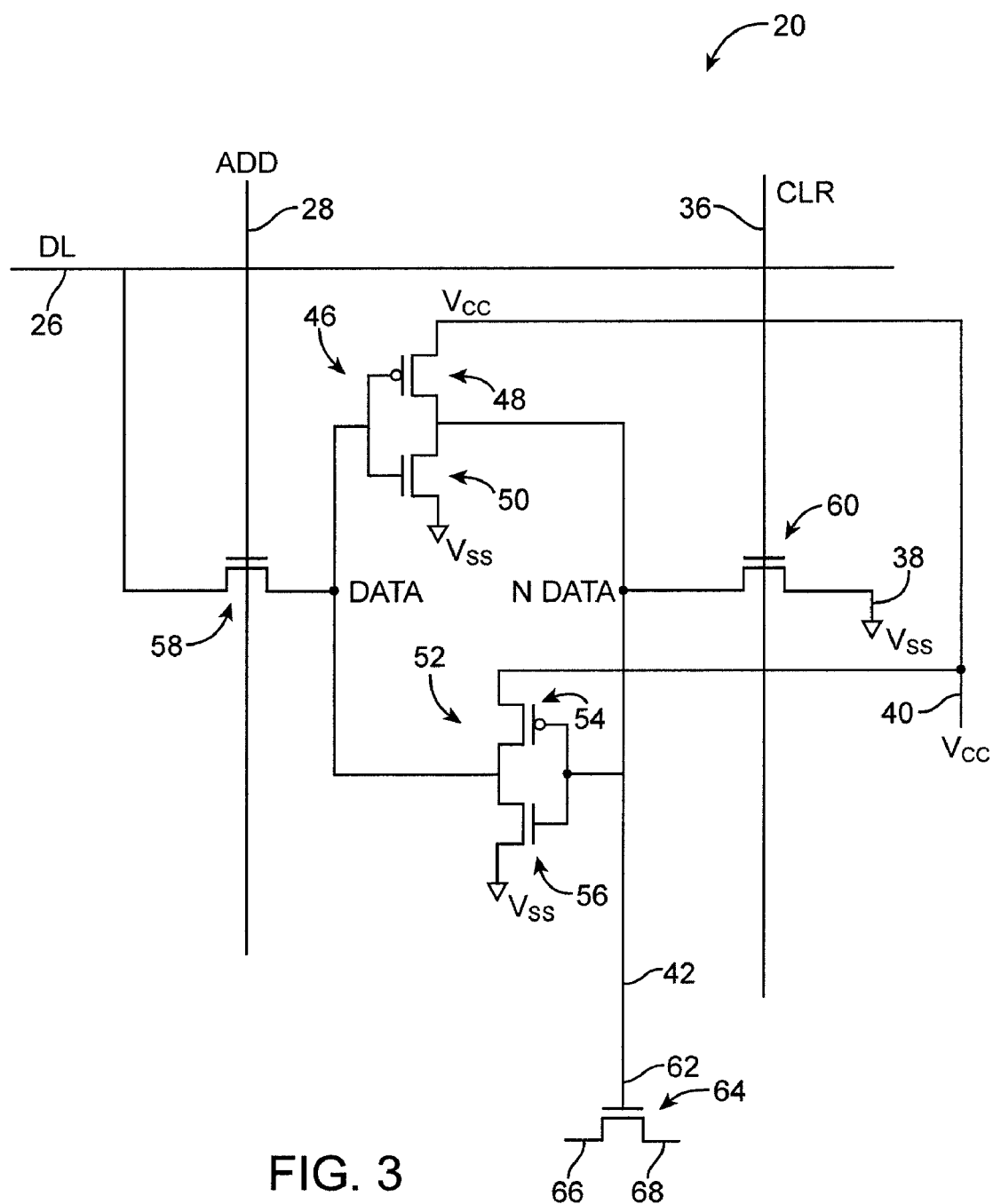
FIG. 3 is a diagram of an illustrative memory element in accordance with an embodiment of the present invention.

A memory element 20 of the type that may be used in array 22 of FIG. 2 is shown in FIG. 3. As shown in FIG. 3, the memory element 20 may be formed from two cross-coupled inverters—inverter 46 and inverter 52. The cross-coupled inverters form a storage element (latch) that allows memory element 20 to serve as a storage cell that stores configuration data. Inverter 46 may have a p-channel metal-oxide-semiconductor (PMOS) transistor 48 and an re-channel metal-oxide-semiconductor (NMOS) transistor 50. Inverter 52 may have a PMOS transistor 54 and NMOS transistor 56. The NMOS clear transistor 60 may be turned on during clear operations by activating clear line 36. This connects complementary data signal NDATA to ground 38 and clears the memory element 20. During normal operation, the value of the control signal on control output line 42 is determined by the value of the complementary data signal NDATA.

When address line 28 is taken high during a write operation, NMOS address transistor 58 is turned on and the signal DL on data line 26 is driven into the memory element 20. The stored data bit in memory element 20 is represented by signal DATA in FIG. 3 and is represented in complementary form by NDATA. If the signal on line 26 is high, signal DATA remains high and the memory element 20 remains in its cleared (erased) state. In the erased state, memory element 20 may be said to contain a logic low or a "zero" bit. The output NDATA on line 42 in this situation will be low. If the signal on line 26 is low during the write operation, DATA will be taken low and, due to the inversion of the low DATA signal by inverter 46, the signal NDATA will be taken high. This makes the output line 42 high. When DATA is low and NDATA is high, memory element 20 may be said to contain a "one" or logic high bit and may be referred to as being "programmed."

The NDATA control signal is applied to the gate 62 of pass transistor 64. When NDATA is low, pass transistor 64 is off. When NDATA is high, pass transistor 64 is on and data is allowed to flow between line 66 and line 68.

Figure 4:
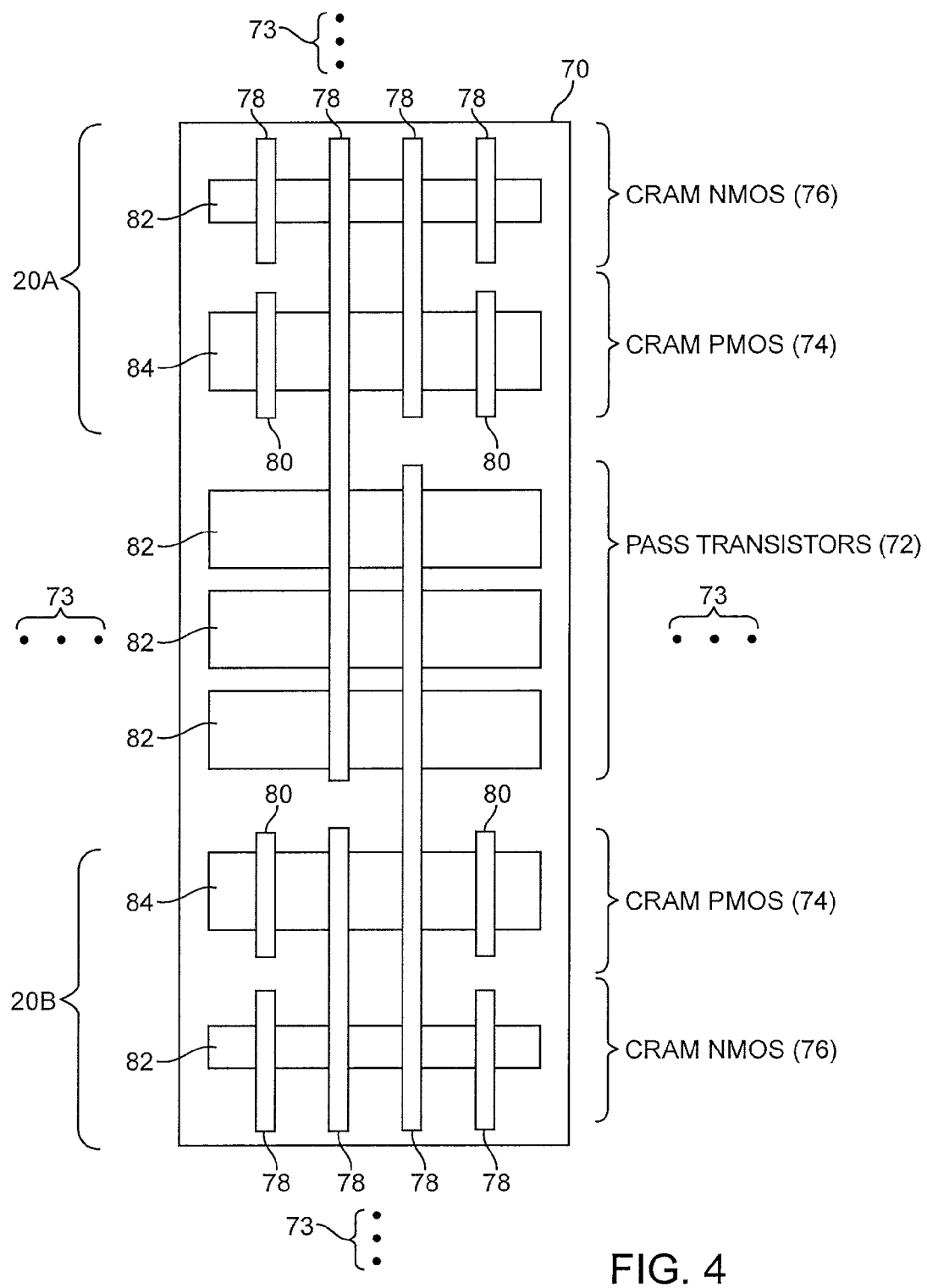
FIG. 4 is a top view of a layout of an illustrative memory block in accordance with an embodiment of the present invention.

Memory elements 20 and pass transistors 64 may be fabricated using a layout of the type shown in FIG. 4. Memory block 70 of FIG. 4 includes a first memory element (CRAM 20A) and a second memory element (CRAM 20B). Multiple pass transistors 64 (shown collectively as pass transistors 72 in FIG. 4) may be interposed between memory elements 20A and 20B.

Each memory element includes a first and second cross-coupled inverters and address and clear transistors, and has one or more associated pass transistors.

In the example of FIG. 4, memory elements 20A and 20B are associated with six pass transistors. More pass transistors or fewer pass transistors may be used, if desired. Pass transistors may be formed using NMOS transistors (as an example).

As shown in FIG. 4, pass transistors 72 may be formed from three n-active diffusion regions 82 and two polysilicon gates 78. Each gate 78 can be shared among three pass transistor regions 82 to form first and second sets of three pass transistors.

Within memory block 70, a first set of CRAM PMOS transistors 74 may be immediately adjacent to the uppermost pass transistors 72, and a second set of CRAM PMOS transistors 74 may be immediately adjacent to the lowermost pass transistors 72. The first set of CRAM PMOS transistors 74 may include the two PMOS transistors in memory element 20A while the second set of CRAM PMOS transistors 74 may include the two PMOS transistors of memory element 20B. The CRAM PMOS transistors 74 may be formed from p-type diffusion regions 84 and polysilicon gates 78. The CRAM PMOS transistors 74 may also have one or more dummy polysilicon gates 80 that are used to satisfy lithographic requirements.

A first set of CRAM NMOS transistors 76 may be immediately adjacent to the uppermost CRAM PMOS transistors 74, and a second set of CRAM NMOS transistors 76 may be immediately adjacent to the lowermost CRAM PMOS transistors 74. The first set of CRAM NMOS transistors 76 may include the two NMOS transistors in the inverters of memory element 20A and associated address and clear transistors for memory element 20A. The second set of CRAM NMOS transistors 76 may include the two NMOS transistors in the inverters of memory element 20B and associated address and clear transistors for memory element 20B. The CRAM NMOS transistors 76 may be formed from n-type diffusion regions 82 and polysilicon gates 78.

The gates of the two NMOS transistors in the inverters of memory element 20A may be connected to the respective gates of the two PMOS transistors in the inverters of the memory element 20A. One of the two gates of the inverter transistors may be connected to a shared gate in pass transistors 72. Similarly, the respective gates of the two NMOS inverter transistors in memory element 20B may be connected to the respective gates of the two PMOS transistors in memory element 20B. One of the two gates of the transistors in the cross-coupled inverters of memory element 20B may be connected to one a shared gate in pass transistors 72. The transistors in memory block 70 may be interconnected to form fully functional memory elements using interconnect lines (not shown).

Memory element circuitry such as the memory block of FIG. 4 may include any suitable number of memory elements and any suitable number of pass transistors. Memory blocks 70 may be repeated (as indicated by dots 73) to form extended continuous rows of memory element circuitry. The rows of memory element circuitry can be arranged into arrays that form banks of memory.

Figure 5:
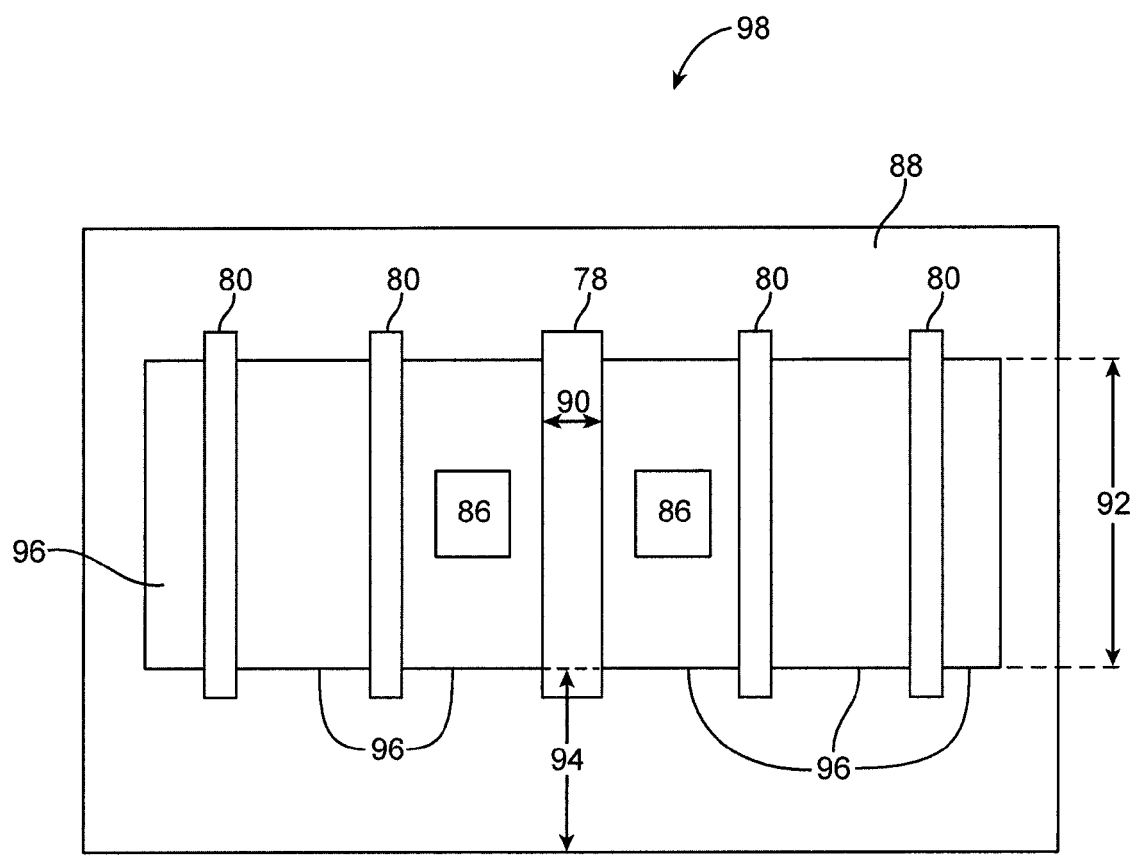
FIG. 5 is a top view of a layout of an illustrative transistor with a stress-inducing layer in accordance with an embodiment of the present invention.

Transistors that are used in memory block 70 may have built-in stress. FIG. 5 shows a top view layout of an illustrative transistor 98. Transistor 98 may be a NMOS or a PMOS transistor. Transistor 98 may include a polysilicon gate 78 and dummy polysilicon gates 80 used to satisfy lithographic requirements. Polysilicon gate 78 may be formed over active diffusion region 96. Source-drain contacts can be formed on either side of gate 78. Gate length 90 parallel to the direction of current flow corresponds to the gate length of transistor 98. Transistor width 92 perpendicular to gate length 90 and in-plane with diffusion region 96 corresponds to the width of transistor 98. A stress-inducing layer 88 may be temporarily formed over the entire transistor during fabrication. Stress-inducing layer 88 can be a tensile stress-inducing layer or a compressive stress-inducing layer. The shortest permissible distance between the border of the active region under gate 78 and the border of stress layer 88 is sometimes referred to as stress margin distance (SMD) 94. Stress margin distance may be adjusted to tune the amount of stress built in into transistor 98. Stress-inducing layer 88 is typically removed after stress has been built in into transistor 98.

Figure 6:
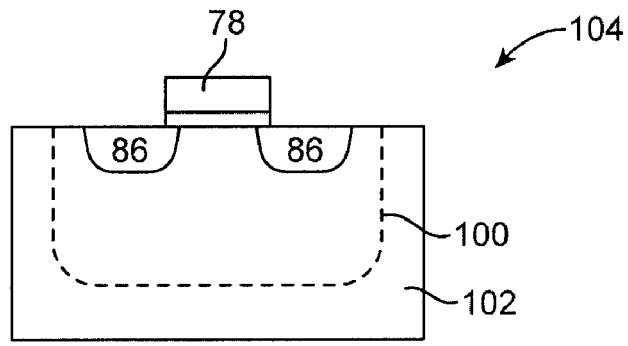
FIGS. 6, 7, and 8 are cross-sectional side views of an illustrative transistor undergoing stress formation in accordance with an embodiment of the present invention.

Stress-inducing layer 88 may be formed during an intermediate process prior to performing contact etch operations in a CMOS process. FIG. 6 shows a cross-sectional side view of an illustrative transistor 104 prior to contact etch. In addition to gate 78 and active region 86, an illustrative well 100 and substrate 102 are shown. Well 100 can be an n-well or a p-well. Substrate 102 can be silicon, germanium, silicon-on-insulator, etc. In a subsequent step, a stress-inducing layer (e.g., a layer of silicon nitride) 106 can be deposited using chemical vapor deposition (CVD) or physical vapor deposition (PVD). The deposition conditions, reactants, and reactant flows may be adjusted to deposit either a tensile stress-inducing layer or compressive stress-inducing layer.

Figure 7:
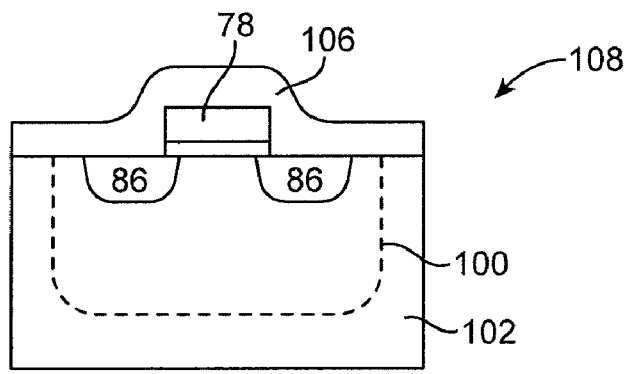

FIG. 7 shows a cross-sectional side view of a representative transistor 108 in which stress-inducing layer 106 has been deposited over gate 78. Stress-inducing layer 106 may be removed (e.g., following a heating and cooling cycle).

Figure 8:
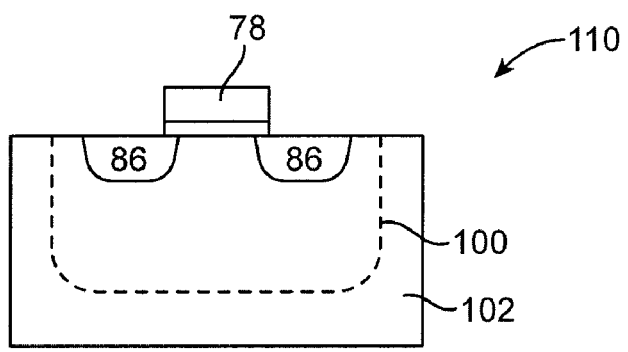

FIG. 8 shows an illustrative transistor 110 after stress-inducing layer 106 has been removed. Even without the stress layer, transistor 110 retains a built-in stress due to a mechanism known as stress memorization. Depending on the type of stress layer used, transistor 110 will exhibit tensile or compressive built-in stress.

Figure 9:
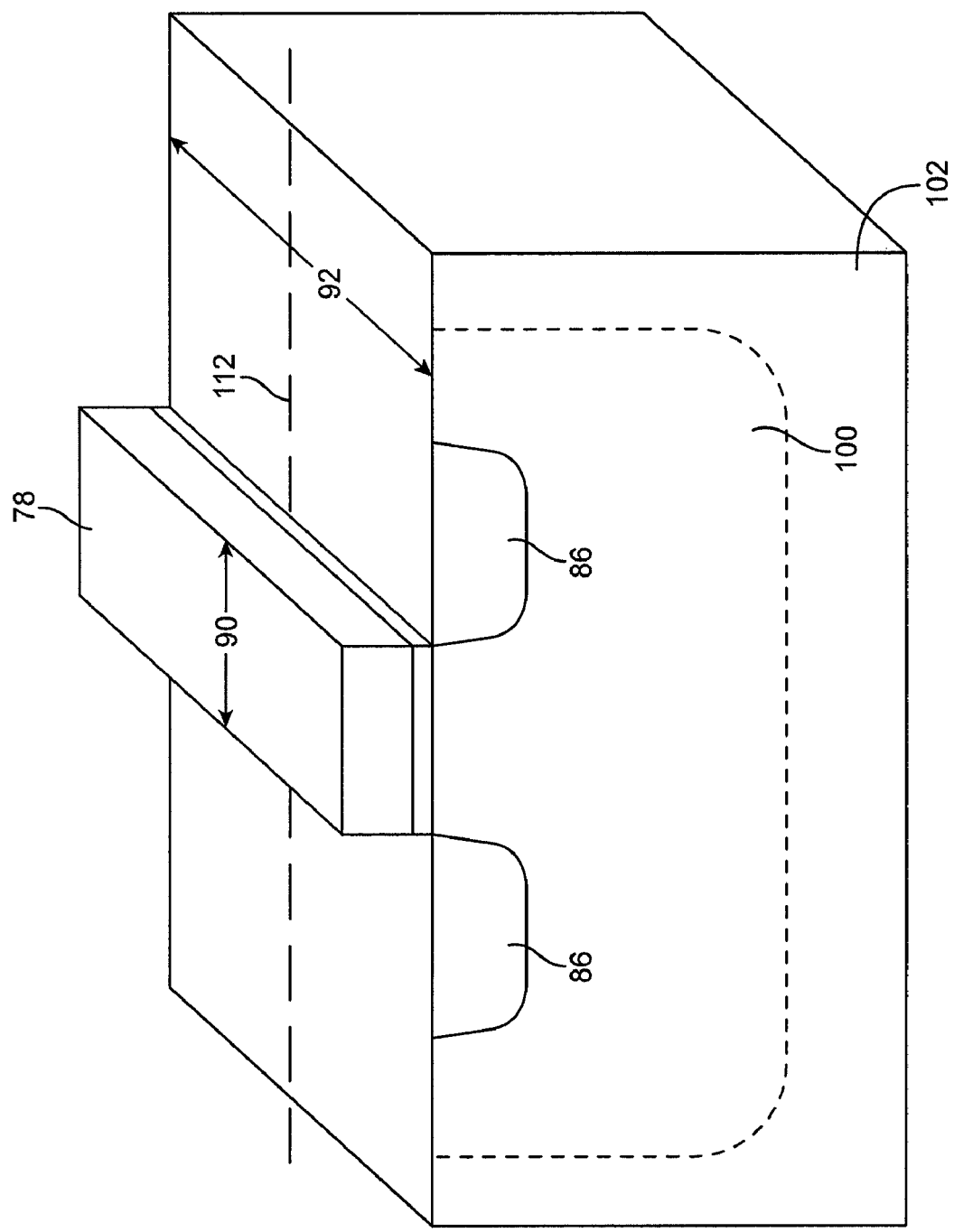
FIG. 9 is a perspective view of an illustrative transistor that may be used in memory element circuitry in accordance with an embodiment of the present invention.

Stress-inducing layer 106 may induce tensile or compressive stress that is parallel to the direction of current flow. To illustrate the direction of the built-in stress, FIG. 9 shows a transistor with an illustrative current flow axis 112. In a scenario in which stress-inducing layer 106 provides tensile stress, gate 78 would experience tensile stress along the direction of axis 112, which would pull gate 78 outward towards the two active regions 86 in opposite directions along axis 112. In another scenario, in which stress-inducing layer 106 provides compressive stress, gate 78 would be pushed inwardly in opposing directions parallel to axis 112.

Figure 10:
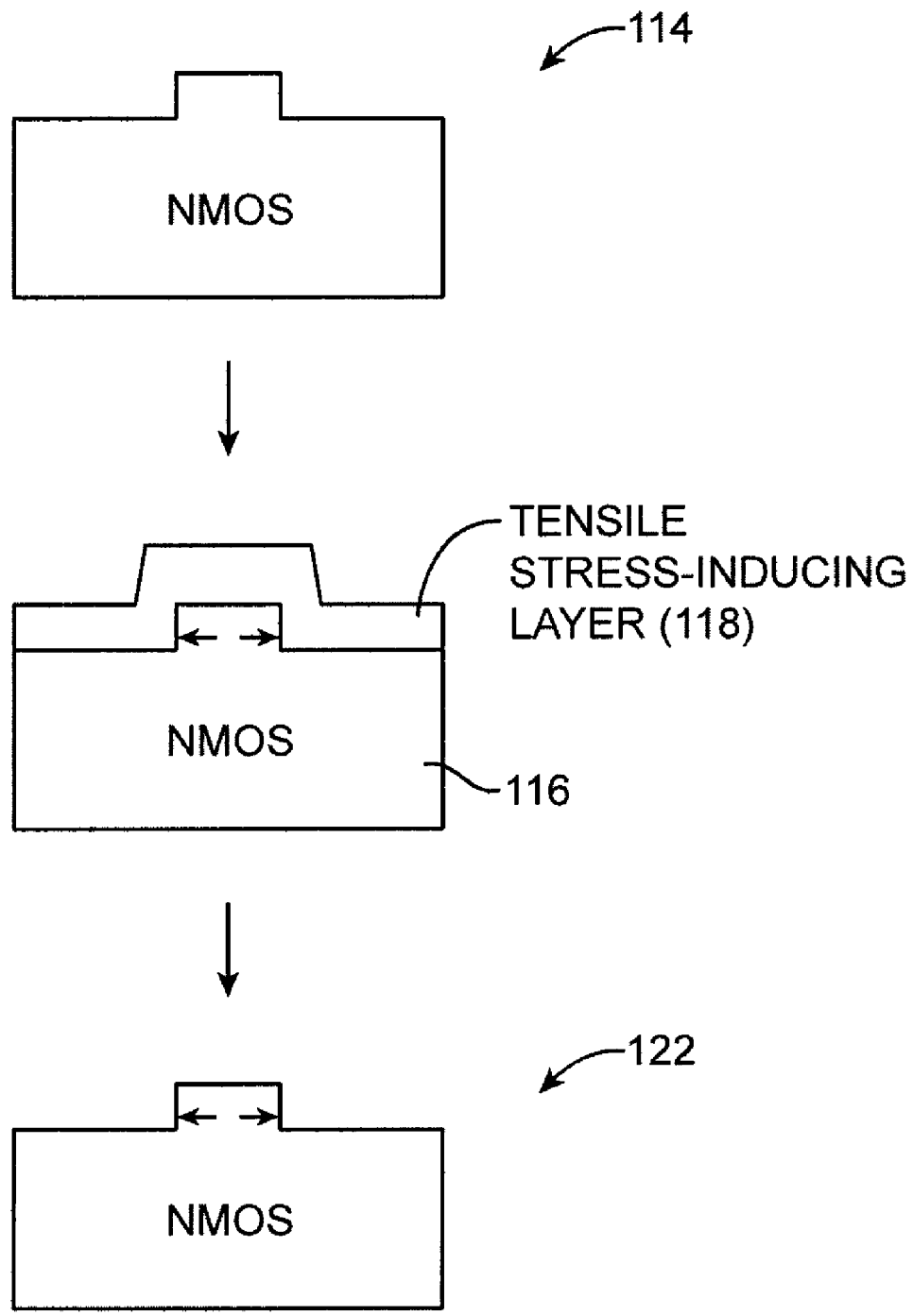
FIG. 10 is a diagram showing cross-sectional side views of an illustrative n-channel metal-oxide-semiconductor (NMOS) transistor undergoing tensile stress formation in accordance with an embodiment of the present invention.

Stress-inducing layers, whether tensile or compressive, may be applied to NMOS or PMOS transistors. FIG. 10 is a diagram showing how a tensile stress-inducing layer 118 may be applied to an NMOS transistor 114. Layer 118 may be deposited using an approach of the type described in connection with FIGS. 6-8. Layer 118 builds in tensile stress, forming an NMOS transistor with tensile stress 116. Thereafter, layer 118 may be removed to form a tensilely stressed NMOS transistor 122. Directions of the tensile stress are labeled in FIG. 10 for clarity. Tensilely stressed NMOS transistors 122 may exhibit enhanced performance due to the increased mobility of majority electron carriers in the n-channel of the transistors.

Figure 11:
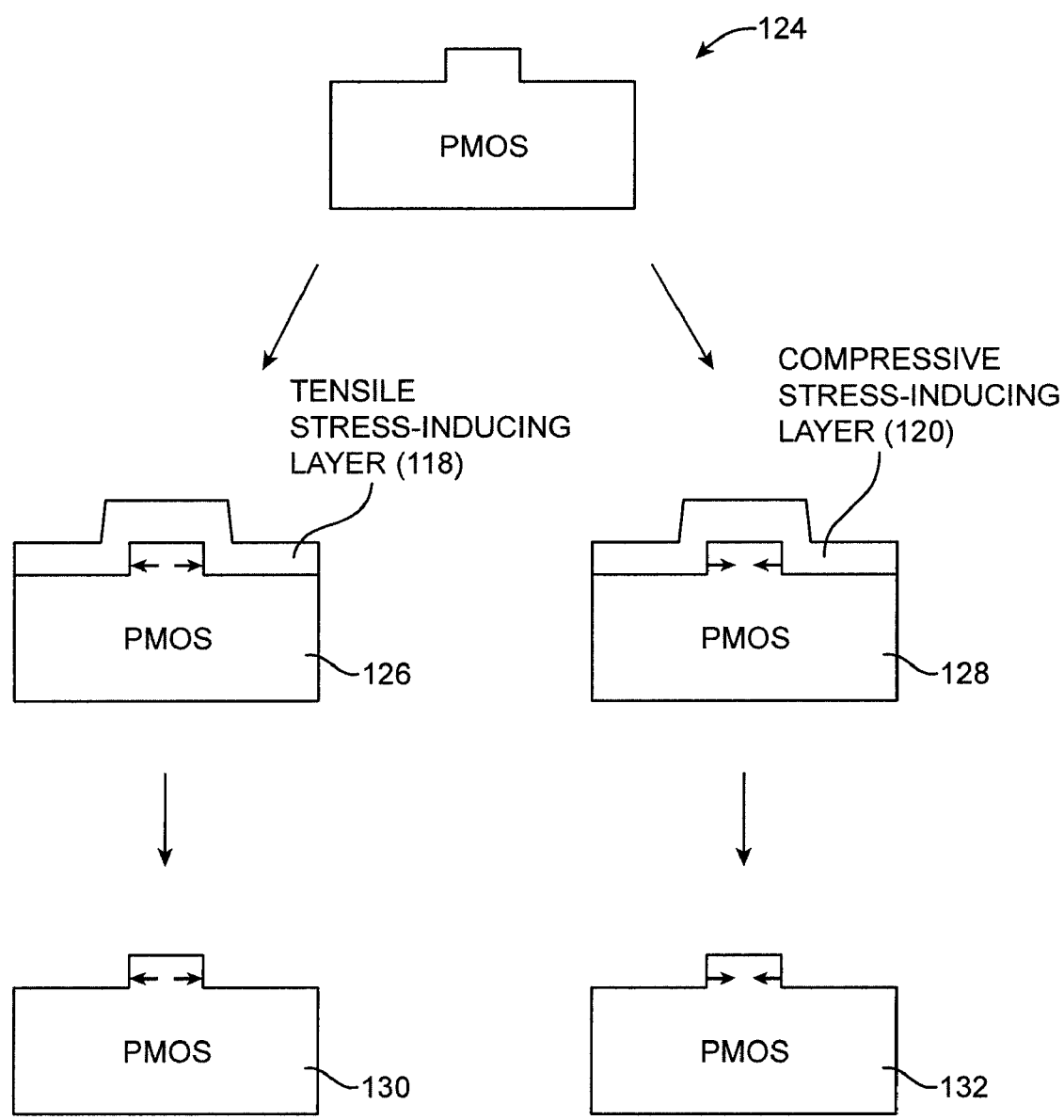
FIG. 11 is a diagram showing the cross-sectional side views of an illustrative p-channel metal-oxide-semiconductor (PMOS) transistor undergoing tensile stress formation and compressive stress formation in accordance with an embodiment of the present invention.

Stress-inducing layers may also be applied to PMOS transistors. Either a tensile stress-inducing layer 118 or compressive stress-inducing layer 120 may be applied to a PMOS transistor 124 as shown in FIG. 11. In a scenario in which tensile stress-inducing layer 118 is applied to PMOS transistor 124, layer 118 builds in tensile stress, forming a PMOS transistor with tensile stress 126. Thereafter, layer 118 may be removed to form a tensilely stressed PMOS transistor 130. In a scenario in which compressive stress-inducing layer 120 is applied to PMOS 124, layer 120 builds in compressive stress, forming a PMOS transistor with compressive stress 128. Layer 120 may then be removed to form a compressively stressed PMOS transistor 132. Directions of tensile stress and compressive are labeled with arrows in FIG. 11. Tensilely stressed PMOS transistor 130 may exhibit degraded performance due to the reduced mobility of majority hole carriers in its p-type channel. Compressively stressed PMOS transistor 132 may exhibit enhanced performance due to the increased mobility of majority hole carriers in its p-type channel.

Figure 12:
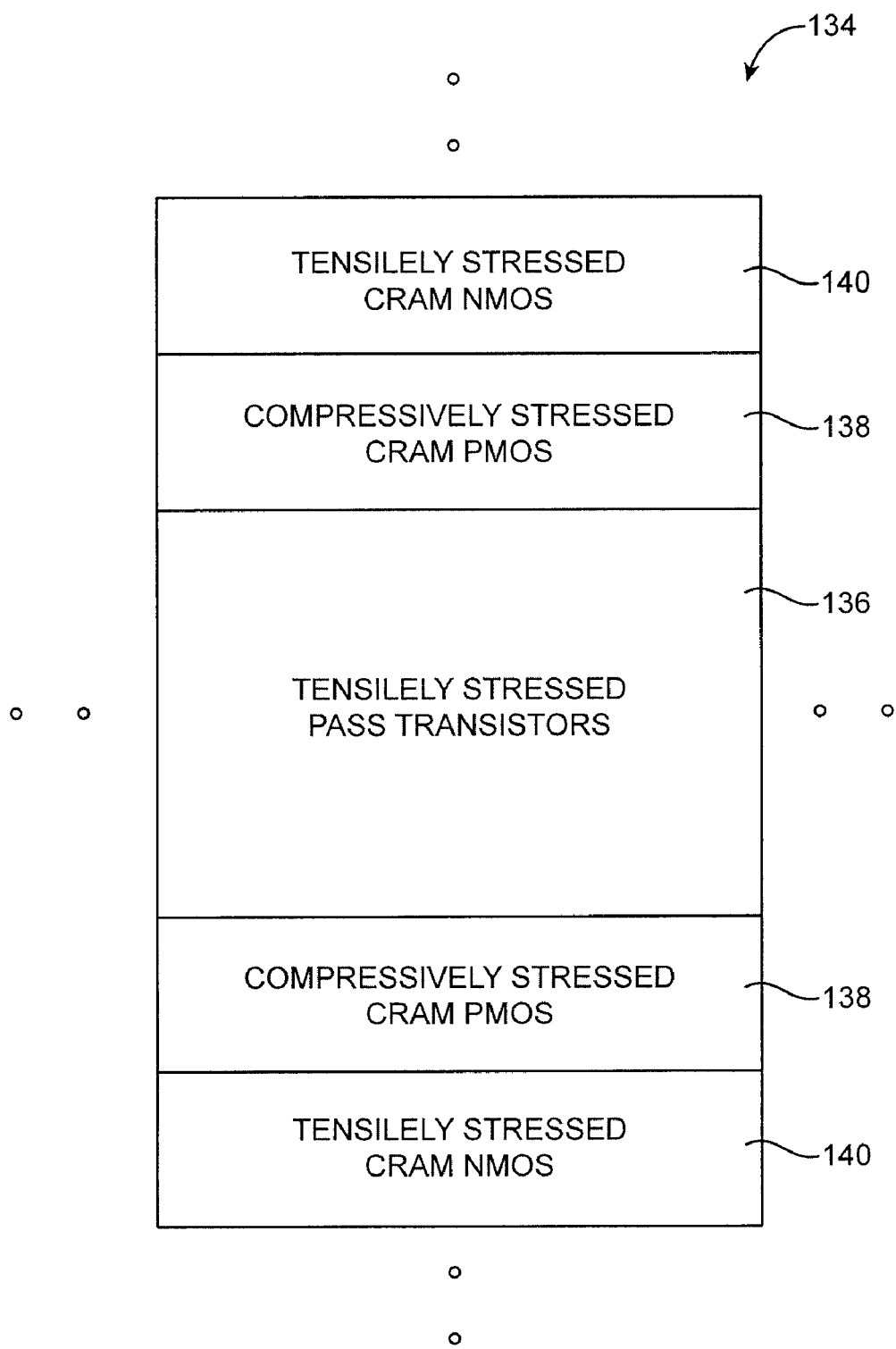
FIG. 12 is a top view of conventional memory element circuitry that includes stressed transistors.

A conventional memory element circuit 134 that has two CRAM cells and interposed pass gates is shown in FIG. 12. The pass gates of circuit 134 are formed using tensilely stressed pass transistors 136, the CRAM PMOS transistors of circuit 134 are formed using compressively stressed CRAM PMOS transistors 138, and the CRAM NMOS transistors of circuit 134 are formed using tensilely stressed CRAM NMOS transistors 140.

Figure 13:
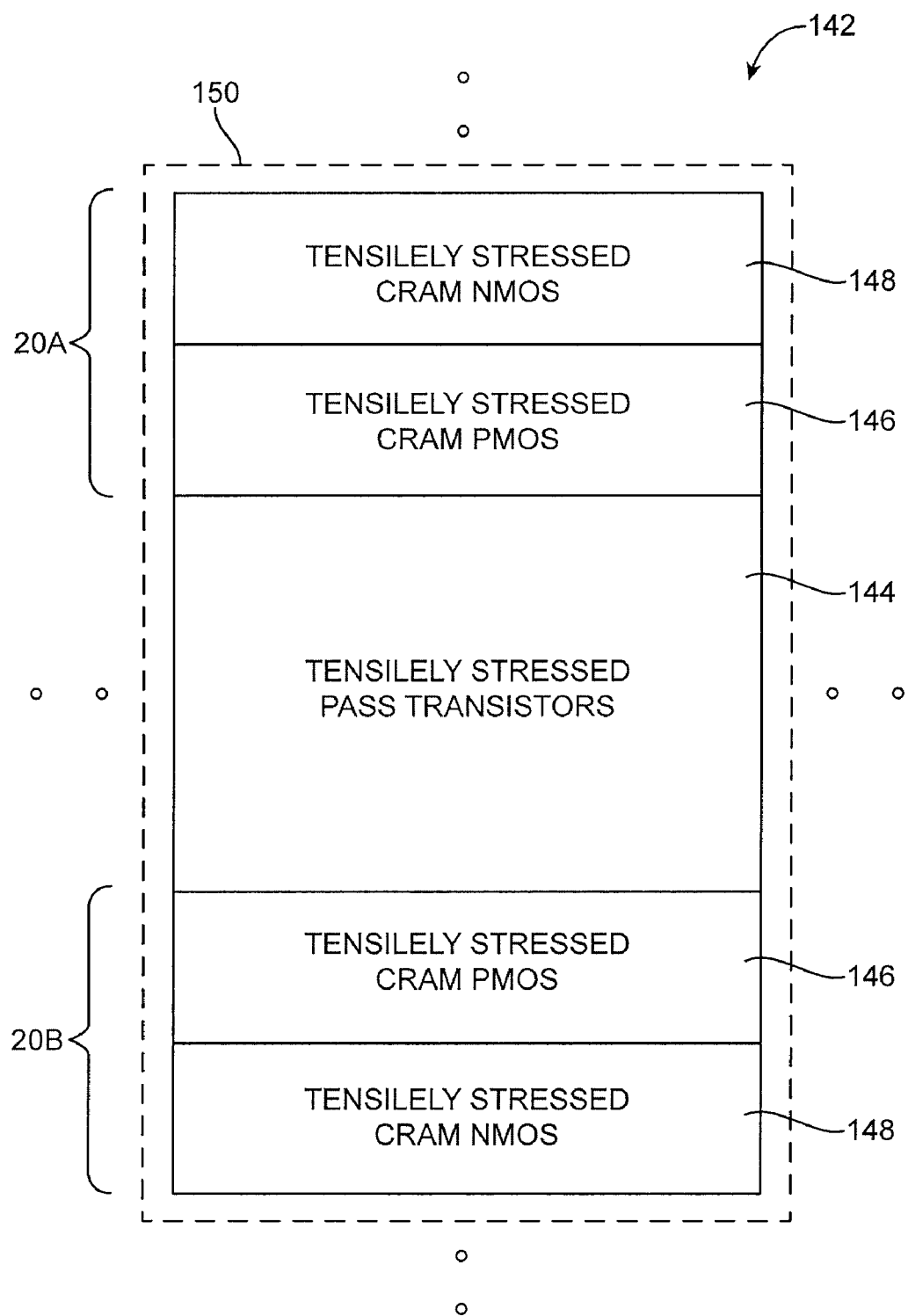
FIG. 13 is a top view of illustrative memory element circuitry that may be formed using a blanket tensile stress-inducing layer in accordance with an embodiment of the present invention.

By stressing the pass transistors 136 with a tensile stress-inducing layer, the performance (e.g., speed) of transistors 136 may be enhanced. The amount of performance enhancement is dependent on the amount of induced stress. Because the amount of induced stress is proportional to SMD 94, performance enhancement can be maximized by increasing SMD. SMD can be increased by extending the tensile stress-inducing layer beyond the border of the pass transistors. Memory block 142 in FIG. 13 is arranged similarly to the layout described previously in FIG. 4. In the arrangement of FIG. 13, the pass transistors have been formed using tensilely stressed pass transistors 144, the CRAM PMOS transistors have been formed using tensilely stressed CRAM PMOS transistors 146, and the CRAM NMOS transistors have been formed using tensilely stressed CRAM NMOS transistors 148. The tensile stress for the transistors in memory block 142 may be created using a blanket tensile stress-inducing layer 150. Layer 150 may temporarily cover the entire memory block 142 during fabrication. The blanket tensile stress-inducing layer 150 increases the SMD of pass transistors 144 (i.e., the built-in stress in transistors 144 may be increased relative to conventional arrangements by forming any compressive stress layers on integrated circuit 10 at a location remote from transistors 144). Doing so may increase drain saturation currents of the tensilely stressed pass transistors 144 by 4% or more.

Tensilely stressed CRAM PMOS transistors 146 may be negatively impacted in terms of speed, but this effect may be counteracted by increasing the width of the PMOS transistors and/or by forward-biasing PMOS body terminals. Increasing the width of transistors 146 may give rise to a minimal and acceptable increase in area. Moreover, degraded PMOS transistor performance is typically not significant, as the speed of memory elements 20 is generally not considered to be a critical bottleneck. This is because elements 20 are static during normal operation. Layer 150 may be removed after stress has been built in into the transistors. Memory block 142 may be extended to form a memory array with any desirable dimension.

Figure 14:
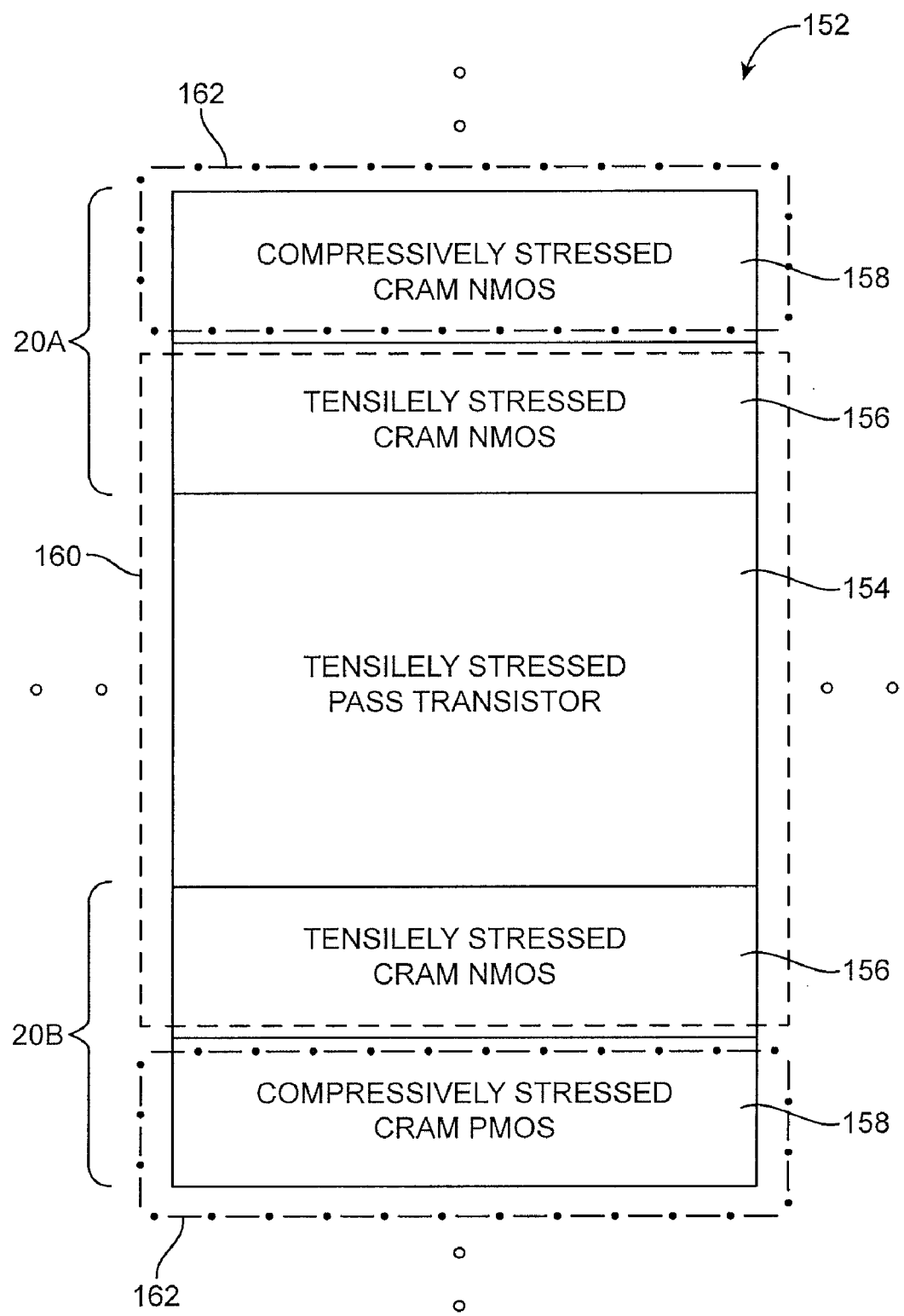
FIG. 14 is a top view of illustrative memory element circuitry that may be implemented with reduced area in accordance with an embodiment of the present invention.

As shown in FIG. 14, it may also be desirable to switch the positions of the CRAM NMOS and CRAM PMOS transistors in order to increase SMD. Memory block 152 of FIG. 14 may be arranged similarly to the layout described in connection with FIG. 4. The pass transistors may be formed using tensilely stressed pass transistors 154, the CRAM NMOS transistors may be formed using tensilely stressed CRAM NMOS transistors 156, and the CRAM PMOS transistors may be formed using compressively stressed CRAM PMOS transistors 158.

The tensile stress for transistors 154 and 156 may be provided by a NMOS tensile stress-inducing layer 160 which may cover the NMOS transistors (i.e., 154 and 156 of FIG. 14). Compressive stress for PMOS transistors 158 may be provided by a compressive stress-inducing layer 162 which may cover the CRAM PMOS transistors 158. Because compressive stress layer 162 is relatively far from pass transistors 154, transistors 154 will exhibit tensile stress that is unaffected by the presence of layer 162. The increased SMD of pass transistors 154 may increase drain saturation currents of the tensilely stressed pass transistors by 2% or more (as an example). The layouts used for tensile stress-inducing layer 160 and compressive stress-inducing layer 162 of FIG. 14 are merely illustrative. Layers 160 and 162 may be removed after stress has been built in into the transistors. Memory element circuit 152 may be repeated to form a memory array with any desirable dimension.

Figure 15:
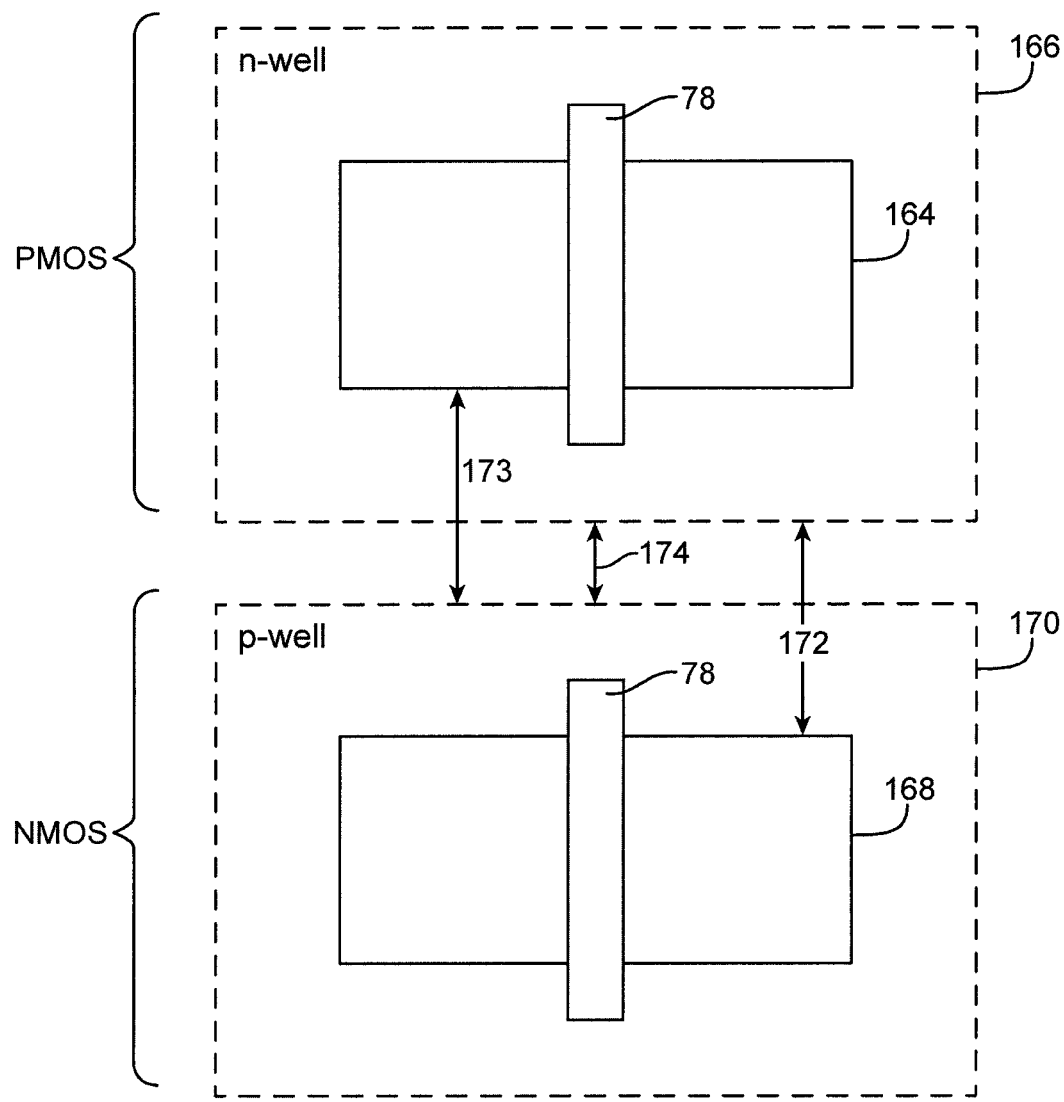
FIG. 15 is a top view of a layout for NMOS and PMOS transistors showing a minimum transistor spacing rule that may be satisfied in accordance with an embodiment of the present invention.

The area of memory block 152 may also provide an area reduction (e.g. a reduction of 7%) compared to conventional memory block. FIG. 15 shows the top view of an NMOS transistor and a PMOS transistor next to one another to illustrate how the area reduction may be achieved. When an NMOS transistor is placed next to a PMOS transistor, there is a minimum spacing requirement imposed by the design rules of the semiconductor fabrication that is being used. One such rule relates to an nwell-to-OD spacing 172, which is defined as the distance from the border of n-well 166 to the border of NMOS active region 168. A second well-to-OD spacing 173 relates to the distance between the border of the p-well 170 to the border of PMOS active region 164. A third well-to-well spacing 174 may be defined as the distance between the border of n-well 169 and the border of p-well 170. The minimum distance that can be used to separate a PMOS transistor from an adjacent NMOS transistor is determined by the maximum of the three spacing requirements (i.e. nwell-to-OD, pwell-to-OD, and well-to-well).

The minimum distance between an NMOS transistor and a PMOS transistor is often greater than the minimum distance between an NMOS transistor and another NMOS transistor. It may therefore be desirable to implement memory element circuits using a minimal number of transitions between regions of NMOS and PMOS transistors. This allows overall area to be minimized.

Figure 16A:
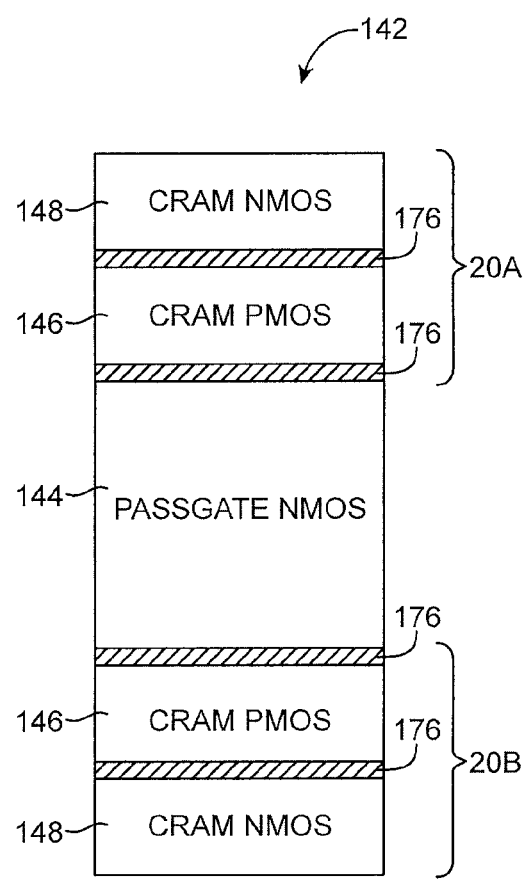
FIGS. 16A and 16B are top views of a memory block of the type shown in FIG. 13 illustrating the impact of minimum transistor spacing rules when various layouts are used in accordance with an embodiment of the present invention.
Figure 16B:
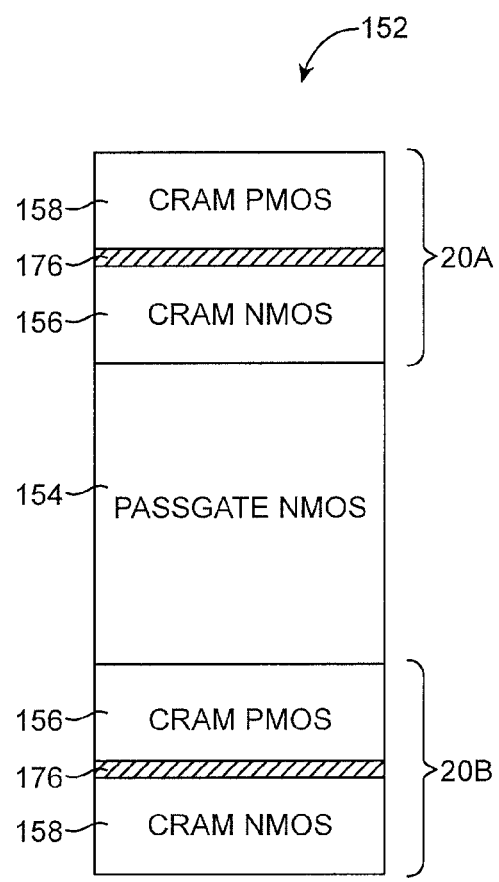

FIG. 16A shows an illustrative memory block 142 having four transition regions 176 between NMOS and PMOS transistors. FIG. 16B shows an illustrative memory block 152 that has only two transition regions 176 between NMOS and PMOS transistors. Use of a smaller number of transitions allows the transistors to be placed closer together. Grouping transistors of the same type together can also allow them to share wells (e.g., neighboring NMOS transistors can share the same p-well). Placing transistors closer together consumes less area on integrated circuit 10. Memory block 152 may have a reduced area (e.g., an area that is reduced by 7% or more) compared to memory block 142.

Figure 17:
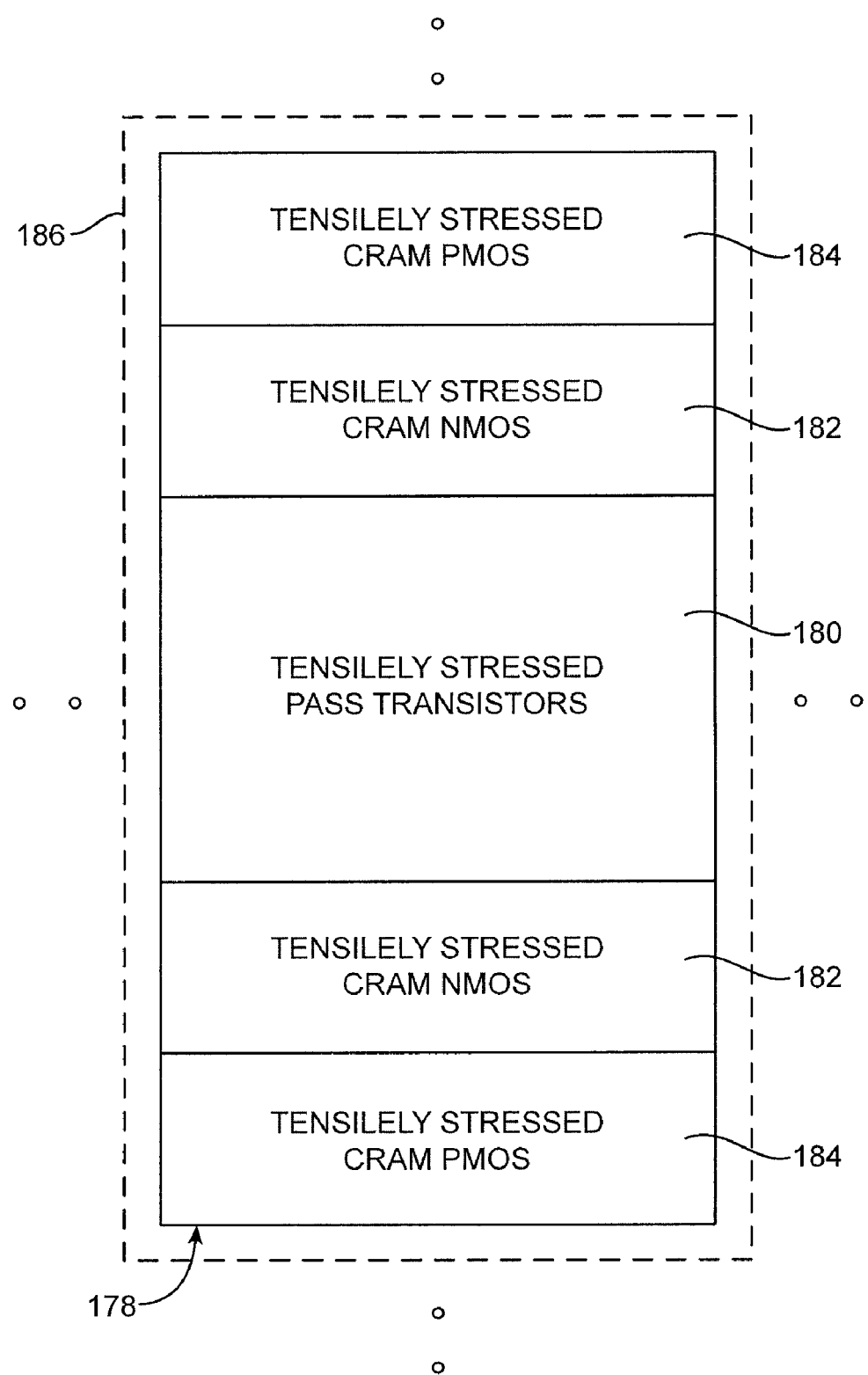
FIG. 17 is a top view of an illustrative memory block with a blanket tensile stress-inducing layer and reduced area in accordance with an embodiment of the present invention.

It is also possible to switch the positions of the CRAM NMOS and CRAM PMOS transistors in a configuration that uses a single blanket tensile stress-inducing layer. This is shown in FIG. 17. Memory block 178 of FIG. 17 is arranged similarly to the layout described previously in FIG. 4. The pass gates of FIG. 17 have been formed using tensilely stressed pass transistors 180, the CRAM PMOS transistors have been formed using tensilely stressed CRAM NMOS transistors 182, and the CRAM NMOS transistors have been formed using tensilely stressed CRAM PMOS transistors 184. The tensile stress for the elements in memory block 178 may be provided by a blanket tensile stress-inducing layer 186 which may temporarily cover the entire memory block 178 during fabrication. The use of blanket layer 186 increases the SMD of the pass transistors 180. Since there are no opposing compressive stress layers surrounding the pass transistors 180, transistors 180 will exhibit tensile stress that will increase drain saturation currents of the tensilely stressed pass transistors 180 by 4% or more (as an example).

The p-well of pass transistors 180 and the p-well of the CRAM NMOS transistors 182 can be shared to provide memory block 178 with an area reduction (e.g., a reduction of 7%) compared to a conventional memory block. Blanket stress-inducing layer 186 is merely illustrative. Layer 186 may be removed after stress has been built in into the transistors. Memory block 178 may be repeated to form a memory array with any desirable dimension.

Memory element circuitry such as the illustrative memory blocks of in FIGS. 13, 14, and 17 may be fabricated using a dual gate oxide process. Use of a dual gate oxide process may reduce the number of required masks relative to a conventional triple gate oxide CMOS process. The layout of the memory elements within the memory blocks may be pre-characterized to improve process variability and predictability of critical transistors. In general, using stress-inducing layers may increase circuitry performance by 5% or more. Optimizing the layout by switching the positions of CRAM NMOS and CRAM PMOS transistors may provide memory block area reductions of 5% or more. Stress-inducing layers and optimized layouts may be scaled for future generations of integrated circuits that use smaller gate lengths.

The foregoing is merely illustrative of the principles of this invention and various modifications can be made by those skilled in the art without departing from the scope and spirit of the invention.

What is claimed is:

1. Memory element circuitry, comprising:
a memory element having tensilely stressed n-channel transistors and tensilely stressed p-channel transistors, wherein the n-channel transistors have channel lengths and are tensilely stressed along their lengths, wherein the p-channel transistors have channels with lengths and are tensilely stressed along their lengths, and wherein a tensile stress layer formed over the memory element is absent during operation of the memory element circuitry.

2. The memory element circuitry defined in claim 1, wherein the tensilely stressed re-channel transistors are immediately adjacent to the tensilely stressed p-channel transistors.

3. The memory element circuitry defined in claim 1, wherein the tensilely stressed re-channel transistors and the tensilely stressed p-channel transistors form a pair of cross-coupled inverters.

4. The memory element circuitry defined in claim 1 further comprising pass transistors, wherein the pass transistors comprise gates that are coupled to the memory element.

5. The memory element circuitry defined in claim 4, wherein the pass transistors comprise tensilely stressed n-channel transistors.

6. Memory element circuitry, comprising:
at least one tensilely stressed n-channel metal-oxide-semiconductor transistor having a gate; and
at least one memory element having an output that supplies a control signal to the gate, wherein the memory element has p-channel metal-oxide-semiconductor transistors and has n-channel metal-oxide-semiconductor transistors, and wherein the n-channel metal-oxide-semiconductor transistors are immediately adjacent to the at least one tensilely stressed n-channel metal-oxide-semiconductor transistor.

7. The memory element circuitry defined in claim 6, wherein the n-channel metal-oxide-semiconductor transistors of the memory element that are adjacent to the at least one tensilely stressed n-channel metal-oxide-semiconductor transistor comprise tensilely stressed n-channel metal-oxide-semiconductor transistors.

8. The memory element circuitry defined in claim 6, wherein the at least one tensilely stressed n-channel metal-oxide-semiconductor transistor comprises a programmable logic pass transistor and wherein the memory element is loaded with configuration data that programs the programmable logic pass transistor.

9. Memory element circuitry, comprising:
at least one tensilely stressed n-channel metal-oxide-semiconductor transistor having a gate; and
at least one memory element having an output that supplies a control signal to the gate, wherein the memory element has tensilely stressed p-channel metal-oxide-semiconductor transistors and has n-channel metal-oxide-semiconductor transistors and wherein the tensilely stressed p-channel metal-oxide-semiconductor transistors are formed immediately adjacent to the at least one tensilely stressed re-channel metal-oxide-semiconductor transistor.

10. The memory element circuitry defined in claim 9, wherein the n-channel metal-oxide-semiconductor transistors of the memory element comprise tensilely stressed n-channel metal-oxide-semiconductor transistors formed immediately adjacent to the tensilely stressed p-channel metal-oxide-semiconductor transistors.

11. The memory element circuitry defined in claim 9, wherein the at least one tensilely stressed n-channel metal-oxide-semiconductor transistor comprises a programmable logic pass transistor and wherein the memory element is loaded with configuration data that programs the programmable logic pass transistor.

12. The memory element circuitry defined in claim 9, wherein the at least one tensilely stressed n-channel metal-oxide-semiconductor transistor, the tensilely stressed p-channel metal-oxide-semiconductor transistors, and the n-channel metal-oxide-semiconductor transistors comprise transistors with built-in tensile stress produced by a blanket tensile layer during fabrication.

13. Circuitry, comprising:
programmable logic circuitry comprising a plurality of programmable logic pass transistors each having a gate; and
a plurality of memory blocks extending in a continuous row, wherein each memory block includes:
a first memory element; and
a second memory element, wherein the first and second memory elements are loaded with configuration data and have outputs operable to supply static control signals, wherein at least some of the plurality of programmable logic pass transistors are interposed between the first memory element and the second memory elements and are operable to receive the static control signals from the first and second memory elements at their gates, and wherein the first and second memory elements each include at least some tensilely stressed transistors that are adjacent to the plurality of programmable logic pass transistors.

14. The circuitry defined in claim 13, wherein the tensilely stressed transistors comprise p-channel metal-oxide-semiconductor transistors.

15. The circuitry defined in claim 14, wherein the tensilely stressed transistors comprise re-channel metal-oxide-semiconductor transistors.

16. The circuitry defined in claim 13, wherein the tensilely stressed transistors comprise re-channel metal-oxide-semiconductor transistors.

* * * * *